United States Patent
Eskerod Madsen

(10) Patent No.: US 12,228,596 B2
(45) Date of Patent: Feb. 18, 2025

(54) POWER QUALITY ANALYSIS SYSTEM AND METHOD FOR MONITORING FROM THE OUTSIDE OF MULTICONDUCTOR CABLES

(71) Applicant: REMONI A/S, Skanderborg (DK)

(72) Inventor: Bo Eskerod Madsen, Østbirk (DK)

(73) Assignee: REMONI A/S, Skanderborg (DK)

( * ) Notice: Subject to any disclaimer, the term of this patent is extended or adjusted under 35 U.S.C. 154(b) by 323 days.

(21) Appl. No.: 17/874,484

(22) Filed: Jul. 27, 2022

(65) Prior Publication Data

US 2022/0365118 A1 Nov. 17, 2022

Related U.S. Application Data

(63) Continuation of application No. PCT/DK2021/050039, filed on Feb. 8, 2021.

(30) Foreign Application Priority Data

Feb. 15, 2020 (DK) .......................... PA 2020 00186

(51) Int. Cl.
    *G01R 19/25* (2006.01)
    *G01R 15/14* (2006.01)
    *G01R 23/20* (2006.01)

(52) U.S. Cl.
    CPC ......... *G01R 19/2513* (2013.01); *G01R 15/14* (2013.01); *G01R 15/144* (2013.01); *G01R 23/20* (2013.01)

(58) Field of Classification Search
    USPC .......................................................... 702/60
    See application file for complete search history.

(56) References Cited

U.S. PATENT DOCUMENTS

| | | |
|---|---|---|
| 5,233,538 A | 8/1993 | Wallis |
| 6,777,953 B2 | 8/2004 | Blades |
| 6,876,203 B2 | 4/2005 | Blades |
| 6,882,158 B2 | 4/2005 | Blades |
| 6,927,579 B2 | 8/2005 | Blades |

(Continued)

FOREIGN PATENT DOCUMENTS

| | | |
|---|---|---|
| DE | 102016217168 A1 | 3/2018 |
| EP | 2618166 B1 | 12/2014 |

(Continued)

*Primary Examiner* — Paul D Lee
(74) *Attorney, Agent, or Firm* — Schmeiser, Olsen & Watts, LLP

(57) ABSTRACT

A power quality analysis system is configured to carry out a power quality analysis in an electrical environment. The system comprises one or more power consuming units each electrically connected to a main power supply by a multi-conductor (multicore) cable and one or more power quality sensors configured to provide one or more power quality analysis measurements. The one or more power quality sensors are clamp-on power quality sensors configured to provide one or more power quality analysis measurements when the clamp-on power quality sensors are clamped onto the outside of or arranged in the proximity of the multiconductor cable. The clamp-on power quality sensors are configured to provide the one or more power quality analysis measurements without being electrically connected to any of the conductors of the multiconductor cable.

16 Claims, 7 Drawing Sheets

(56) References Cited

U.S. PATENT DOCUMENTS

| | | |
|---|---|---|
| 7,265,533 B2 | 9/2007 | Lightbody et al. |
| 7,369,950 B2 * | 5/2008 | Wall .................... G06Q 30/04 |
| | | 702/57 |
| 8,447,541 B2 | 5/2013 | Rada et al. |
| 8,659,286 B2 | 2/2014 | Reynolds |
| 8,664,937 B2 | 3/2014 | Fisera |
| 8,868,359 B2 | 10/2014 | Ganesh et al. |
| 8,970,206 B2 | 3/2015 | Cheng et al. |
| 8,983,670 B2 | 3/2015 | Shetty et al. |
| 9,020,769 B2 | 4/2015 | Rada et al. |
| 9,225,389 B2 | 12/2015 | Veronesi et al. |
| 9,310,401 B2 | 4/2016 | Tsao et al. |
| 9,547,026 B1 | 1/2017 | Chraim et al. |
| 9,754,329 B2 | 9/2017 | Lin et al. |
| 9,791,477 B2 | 10/2017 | Lorek |
| 10,187,707 B2 | 1/2019 | Norwood et al. |
| 10,387,284 B2 | 8/2019 | Barbis |
| 10,755,549 B2 | 8/2020 | Pop |
| 10,761,147 B2 | 9/2020 | Beaudet |
| 10,788,516 B2 | 9/2020 | Hui et al. |
| 10,859,604 B2 | 12/2020 | Lorek |
| 11,175,320 B2 | 11/2021 | Selvaggi |
| 11,262,386 B2 | 3/2022 | Donnal et al. |
| 11,320,467 B1 | 5/2022 | Aljohani et al. |
| 11,358,424 B2 | 6/2022 | Kulkarni et al. |
| 11,506,546 B2 | 11/2022 | Blair |
| 2005/0083206 A1 | 4/2005 | Couch et al. |
| 2010/0315092 A1 * | 12/2010 | Nacson ................. G01R 31/52 |
| | | 324/510 |
| 2012/0001617 A1 * | 1/2012 | Reynolds ............... G01R 15/18 |
| | | 324/74 |
| 2012/0086433 A1 | 4/2012 | Cheng et al. |
| 2014/0320125 A1 | 10/2014 | Leeb et al. |
| 2014/0343878 A1 * | 11/2014 | Gudmundsson ... G01R 29/0814 |
| | | 702/64 |
| 2015/0318686 A1 | 11/2015 | Hosny et al. |
| 2018/0088159 A1 | 3/2018 | Heintzelman et al. |
| 2018/0106851 A1 | 4/2018 | Schweitzer, III et al. |
| 2020/0011909 A1 * | 1/2020 | Bickel ..................... G01R 22/10 |
| 2021/0080514 A1 | 3/2021 | Beaudet et al. |
| 2021/0111561 A1 | 4/2021 | William |
| 2022/0376501 A1 | 11/2022 | Pong et al. |
| 2023/0030682 A1 | 2/2023 | Roy et al. |
| 2024/0085468 A1 | 3/2024 | Sepulveda Leon et al. |

FOREIGN PATENT DOCUMENTS

| | | |
|---|---|---|
| EP | 2489987 B1 | 9/2018 |
| EP | 1766424 B1 | 11/2018 |
| EP | 2518520 B1 | 3/2021 |
| EP | 3837559 B1 | 1/2023 |
| EP | 4273563 A1 | 11/2023 |
| EP | 4030172 B1 | 2/2024 |
| EP | 4005047 B1 | 5/2024 |
| WO | 2015160779 A1 | 10/2015 |
| WO | 2018209436 A1 | 11/2018 |
| WO | 2019139540 A1 | 7/2019 |
| WO | 23152424 A1 | 8/2023 |

* cited by examiner

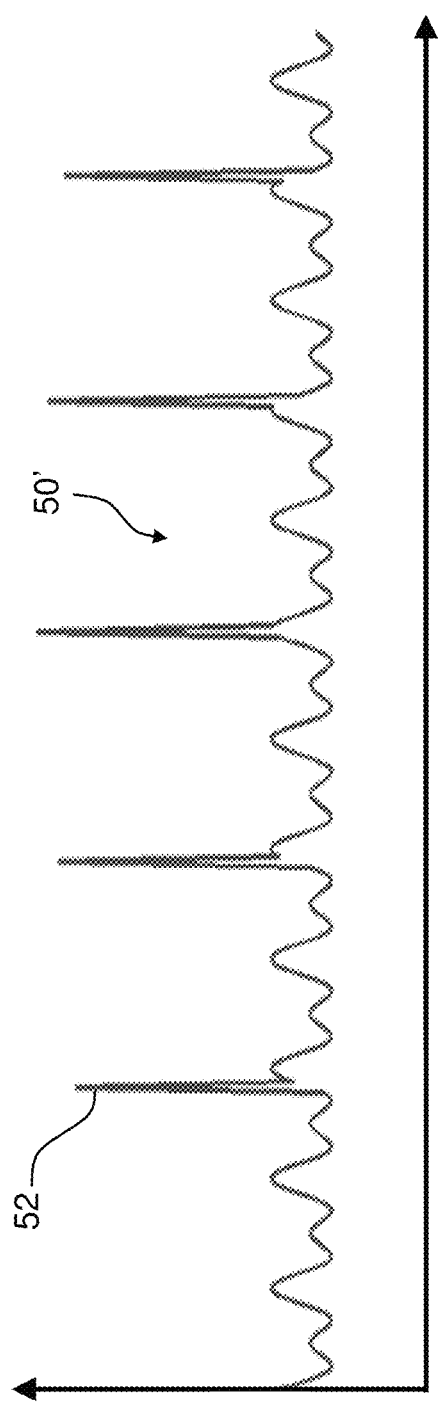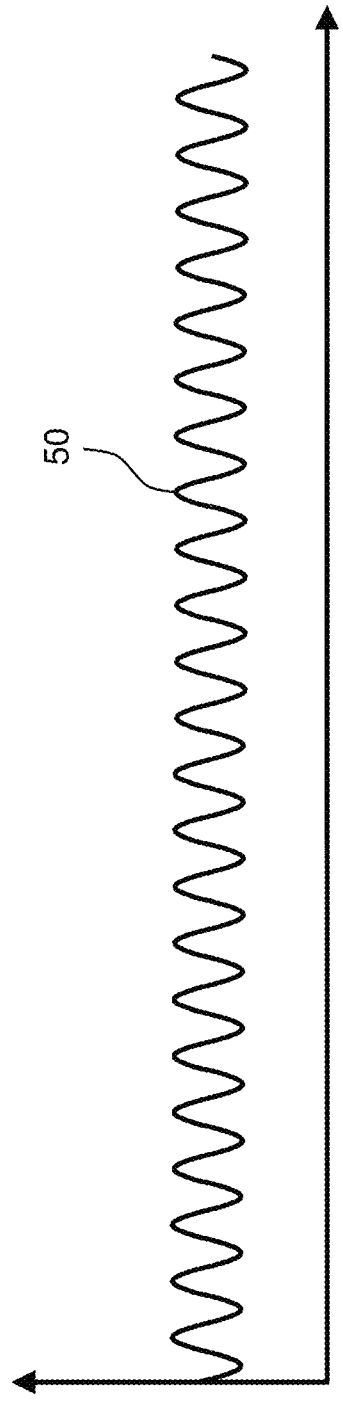

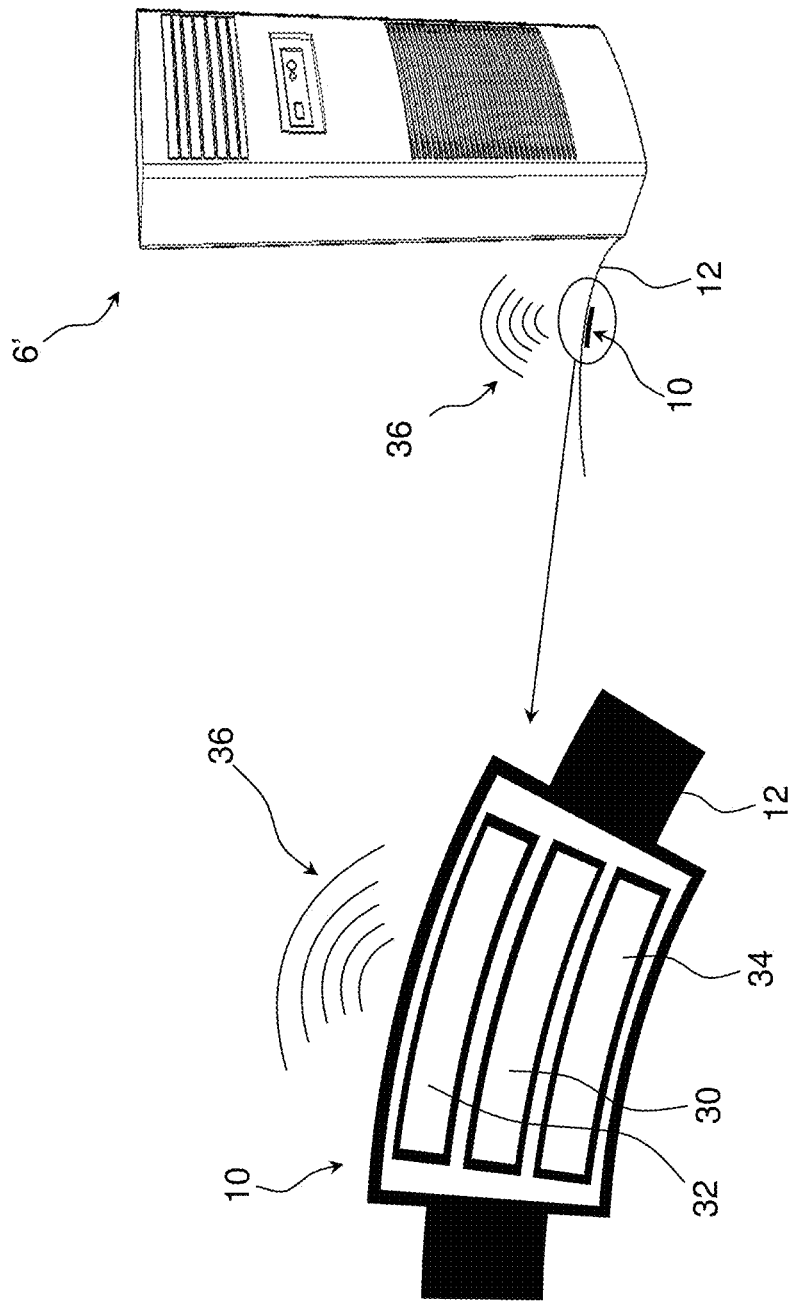

POWER QUALITY ANALYSIS SYSTEM AND METHOD FOR MONITORING FROM THE OUTSIDE OF MULTICONDUCTOR CABLES

CROSS REFERENCE TO RELATED APPLICATIONS

This application is a continuation under 35 U.S.C. 111 of International Patent Application No. PCT/DK2021/050039, filed Feb. 8, 2021, which claims the benefit of and priority to Danish Application No. PA 2020 00186, filed Feb. 15, 2020, each of which is hereby incorporated by reference in its entirety.

FIELD OF INVENTION

The present invention relates to a power quality analyzer system configured to determine power quality on the basis of measurements made by a plurality of sensors arranged outside a multiconductor cable. The invention also relates to a method for performing power quality analysis on the basis of measurements made by a plurality of sensors arranged outside a multiconductor cable.

BACKGROUND

Power quality relates to various aspects of power system engineering including transmission and distribution level analyses as well as end-user problems.

Electric power quality has become the concern of utilities, end users, architects, and civil engineers as well as manufacturers. Electric power quality has become an important part of power systems and electric machines.

Power quality is normally considered to express the quality of voltage and/or the quality of current. Accordingly, power quality can be defined as the measure, analysis, and improvement of the bus voltage to maintain a sinusoidal waveform at a predefined rated voltage and frequency. This definition includes all momentary and steady-state phenomena.

Power quality analysis involves analysis of voltage level, frequency, and waveform. Good power quality is achieved when the following criteria are met:
a) the supply voltage is steady and stays within the prescribed range,
b) the alternating current (AC) frequency is close to the rated value and
c) the voltage curve is a smooth sine waveform.

On the other hand, the power quality is poor when either of the above mentioned criteria a), b) or c) is not complied with.

As example, the voltage curve shown in FIG. 1A comprises spikes and thus it is not a smooth sine waveform as required in criterion c).

Power quality issues (poor power quality) cause unit failure and thereby production break down and loss, plus energy loss. By locating the electric devices that cause the undesired power quality issues, it is possible to reduce the present loss of resources and money. In the European Union, the present saving potential is 151.7 billion Euro.

The prior art solutions are, however, both difficult and costly to install because they need to be electrically connected to the multiconductor electricity cables. Accordingly, when applying these solutions, it is required to break into the multiconductor electricity cables to monitor the power quality. This has been a major unsolved challenge for decades.

Power quality disturbances cause expenditures in various accounts including:
Work in progress including the costs of raw material involved in production that is inevitably lost, labor costs involved in the production, extra labor needed to make up lost production;
Loss of energy, due to extra heat generated in the distribution grid and the machines;
Equipment malfunctioning—if a device is affected, the consequences can be slow down of the production process, extra 'idle' time.
Equipment damage—if essential equipment is affected, consequences can be complete damage of the device, shortening of its lifetime, extra maintenance, need of stand-by device.
Staff costs—this is the cost caused by personnel rendered unproductive by disrupted workflow.

There is an increasing focus on power quality analysis, due to the growing share of electronic power consumers, such as light-emitting diode (LED) and switch mode power supplies because these electronic power consumers cause unwanted voltage spikes and harmonics in the grid power supply.

US2005083206A1 discloses an electrical monitoring device that includes: an attachment arrangement adapted to attach the device, non-invasively, to an electrical supply line, a current sensor adapted to sense waveform characteristics relating to current flowing through the supply line, a voltage sensor adapted to sense voltage waveform characteristics of the supply line, and a processor programmed to calculate a power component using the current waveform characteristics and voltage waveform characteristics. The device also includes a wireless transmitter configured to transmit the power component to a monitoring location. This solution is, however, only suitable for analyzing single conductor cables. Moreover, the solution disclosed in US2005083206A1 is not suitable for detecting voltage spikes, harmonics, transients, and similar problematic power quality distortions. Accordingly, it would be desirable to have a monitoring system that is capable of detecting power quality distortions, wherein the monitoring system is suitable for performing measurements from the outside of multiconductor cables.

The prior art power quality analysis tools are expensive because they require costly sensors and because these sensors are required to be installed by being electrically connected to a conductor. Because the sensors must be installed on the single current conductor, the cables for the units (devices) to be monitored, must be split. This splitting procedure introduces both cost, risk of damaging the electrical installations, and hazard to the person installing it.

Accordingly, it would be desirable to have a method and device enabling an alternative power quality analysis that reduces or even eliminates the disadvantages of the prior art solutions.

Therefore, it is an object of the present invention to provide a method and a device which reduces or even eliminates the above-mentioned disadvantages of the prior art.

BRIEF DESCRIPTION

Power quality analysis systems disclosed herein are power quality analysis systems configured to carry out a power quality analysis and to detect power quality distortions (spikes, harmonics, and transients) in an electrical environment, comprising:

one or more power consuming units each being electrically connected to a main power supply by means of a multiconductor (multicore) cable; and a plurality of power quality sensors configured to provide one or more power quality analysis measurements, wherein the power quality sensors are clamp-on power quality sensors configured to provide one or more power quality analysis measurements and to detect power quality distortions when the clamp-on power quality sensors are clamped onto the outside of or arranged in the proximity of the multiconductor cable, wherein the clamp-on power quality sensors are configured to provide the one or more power quality analysis measurements without being electrically connected to any of the conductors of the multiconductor cable, wherein each of the clamp-on power quality sensors comprises a plurality of coils, Hall-effect sensors, and/or capacitive probes, wherein the power quality analysis system comprises at least one central power quality unit sensor arranged and configured to measure the over-all power quality, wherein the power quality analysis system comprises a calculation unit adapted to use a mathematical statistical model which combines measurements made by the clamp-on power quality sensors and measurements made by the central power quality unit sensor, wherein the multiconductor (multicore) cable comprises a plurality of distinct conductors that are insulated from each other, wherein the mathematical statistic model comprises:

a mathematical function component modelling the latent mapping from the central power quality unit sensor measurements onto the clamp-on power quality sensors measurements; and a stochastic component modelling the measurement noise and the part of each central power quality unit sensor measurement associated with usage which are not measured by clamp-on power quality sensor(s).

Hereby, it is possible to provide a system that is easier to use and less expensive than the prior art systems.

The power consuming units may be any type of electrical devices including, pumps, frequency converters, power supplies and domestic appliances configured to be electrically connected to a main power supply by means of a multiconductor cable. In an embodiment, the main power supply is the mains.

The power quality sensors are configured to provide one or more power quality analysis measurements.

In an embodiment, the power quality sensors are configured to measure the frequency of a voltage signal (even if the frequency is varying).

In an embodiment, the power quality sensors are configured to measure the frequency of a current signal.

In an embodiment, the power quality sensors are configured to measure spikes having a larger amplitude than the maximum amplitude of the main sinus shaped voltage current signal or a current signal.

In an embodiment, the power quality sensors are configured to measure harmonics currents/voltages overlying (superimposing) the main sinus shaped current/voltages.

In an embodiment, the power quality sensors are configured to measure power quality distortions defined as spikes, harmonics, and transients.

The one or more power quality sensors are clamp-on power quality sensors configured to provide one or more power quality analysis measurements and hereby detect power quality distortions when the clamp-on power quality sensors are clamped onto the outside of or arranged in the proximity of the multiconductor cable. Accordingly, no electrical contact to any of the conductors of the multiconductor cable is required. This is a major advantage compared with the prior art solutions.

Each power quality sensor comprises a plurality of sub-sensors. Each sub-sensor is designed as a coil and/or a Hall-effect sensor and/or a capacitive probe. The sub-sensors are placed in such a manner that the different sensor members (sub-sensors) measure different superpositions of the combined electromagnetic fields induced by the conductors inside the multiconductor cable.

In an embodiment, the main sensor member is a coil.

In an embodiment, the main sensor member is a Hall-effect sensor.

In an embodiment, the main sensor member is a capacitive probe.

In an embodiment, the additional sensor members are coils.

In an embodiment, the additional sensor members are Hall-effect sensors.

In an embodiment, the additional sensor members are capacitive probes.

In an embodiment, the sub-sensors comprise a main sensor member and the additional sensor members.

The clamp-on power quality sensors are configured to provide the one or more power quality analysis measurements without being electrically connected to any of the conductors of the multiconductor.

In an embodiment, the one or more clamp-on power quality sensors are configured to provide one or more power quality analysis measurements when the clamp-on power quality sensors are clamped onto the outside of the multiconductor cable.

In an embodiment, the one or more clamp-on power quality sensors are configured to provide one or more power quality analysis measurements when the clamp-on power quality sensors are arranged in the proximity of the multiconductor cable. This means that the power quality sensors can be arranged a short distance (e.g. less than one centimetre) from the multiconductor, e.g., using mechanical structures adapted to fix the sensors a short distance from the multiconductor.

The power quality analysis system comprises at least one central power quality unit sensor arranged and configured to measure the over-all power quality. By the term "central power quality unit sensor" is meant a unit configured to measure the overall power parameters (including voltage and/or current as function of time) of at least a section of the power consuming units.

A "central power quality unit sensor" may be a "meter" configured to measure the overall flow or power including voltage and/or current versus time of at least a section of the power consuming units by a predefined accuracy, preferably a high accuracy. Such "central power quality unit sensor" or "meter" is typically used to perform precise measuring of electricity consumption.

In a power quality analysis system disclosed herein it would be possible to clamp-on power quality sensors having significantly lower data resolution and accuracy than the "central power quality unit sensors" or "meters" of the system. By using a mathematical statistic model, it is possible to "compensate" for the lower data resolution and accuracy of the clamp-on power quality sensors. Hereby an overall measure of at least a section of the power consuming units can be provided.

It may be an advantage that the power quality analysis system comprises a number of "central power quality unit sensors" or "meters" configured to measure power and/or voltage and/or current versus time of all the power consuming units and to send information to a receiving unit configured to process the data or forward the data.

It may be an advantage that the "central power quality unit sensors" or "meters" are capable of providing a very accurate measurement so that the detected data can be used to provide accurate estimates and/or predictions of parameters of the power consuming units.

It may be an advantage that the "central power quality unit sensors" or "meters" are capable of providing information of suspected power quality issues to the clamp-on power quality sensors, so they only need to send data from the suspected time interval. Significant usage of data bandwidth and sensor energy consumption can hereby be saved.

The central power quality unit sensor is arranged a distance from the power quality sensors, typically, in a switchboard.

In an embodiment, the distance between the central power quality unit sensor and the power quality sensors is more than 5 m.

In an embodiment, the distance between the central power quality unit sensor and the power quality sensors is more than 50 m.

In an embodiment, the distance between the central power quality unit sensor and the power quality sensors is more than 100 m.

In an embodiment, the distance between the central power quality unit sensor and the power quality sensors is more than 500 m.

In an embodiment, the distance between the central power quality unit sensor and the power quality sensors is more than 1000 m.

In an embodiment, the distance between the central power quality unit sensor and the power quality sensors is more than 5000 m.

It may be an advantage that the "central power quality unit sensors" or "meters" are configured to pre-analyze the measurements to save data transfer bandwidth and sensor energy consumption.

It may be an advantage that the clamp-on power quality sensors are configured to pre-analyze the measurements to save data transfer bandwidth and sensor energy consumption.

It is possible to have a power quality analysis system, in which not all power consuming units are equipped with a clamp-on power quality sensor and where "central power quality unit sensors" or "meters" measure the power and/or current and/or voltage of more power consuming units than the power consuming units equipped with a clamp-on power quality sensor.

The mathematical statistic model is typically configured to estimate and/or predict one or more parameter (power and/or voltage and/or current and/or waveform and/or frequency) of the power consuming units on the basis of the information from the clamp-on power quality sensors and from the "central power quality unit sensors" or "meters" even if not all power consuming units are equipped with a clamp-on power quality sensor.

The power quality analysis system comprises a calculation unit adapted to use a mathematical statistical model which combines measurements made by the clamp-on power quality sensors and measurements made by the central power quality unit sensor. Hereby, it is possible to apply measurements of low resolution and/or accuracy and still achieve a high-resolution/high-accuracy estimation. Moreover, the mathematical statistical model can compare the current measurements made by the clamp-on power quality sensor(s) and the current measurements and voltage made by the "central power quality unit sensors" or "meters" and hereby locate power consuming units that cause poor power quality.

In an embodiment, the power quality analysis system comprises a time synchronization unit configured to synchronize the measurements from the clamp-on power quality sensor(s) and the central power quality unit sensor at a predefined frequency. Hereby, it is possible to link corresponding measurements made by the clamp-on power quality sensor(s) and the central power quality unit sensor in order to compare the corresponding measurements.

In an embodiment, the predefined frequency is every 20 ms.

In an embodiment, the predefined frequency is every 10 ms.

In an embodiment, the predefined frequency is every 5 ms.

In an embodiment, the predefined frequency is every 2 ms.

In an embodiment, the clamp-on power quality sensor(s) is/are configured to measure both the magnetic field and the electric field of the multiconductor. Hereby, it is possible to measure both the currents and the voltage at the sensors and thereby achieve multiple power quality measurements directly from the single clamp-on power quality sensor.

In an embodiment, the central power quality unit sensor(s) is/are configured to measure both the magnetic field and the electric field of the multiconductor mains (cables). Hereby, it is possible to measure both the currents and the voltage at the sensor and thereby achieve multiple power quality measurements directly from the single central power quality sensor/meter.

In an embodiment, at least some of the clamp-on power quality sensor(s) and/or central power quality unit sensor(s) are configured to communicate wirelessly with one or more external devices. Hereby, it is possible to provide a flexible and user-friendly system that is easy to install.

It may be an advantage that at least some of the clamp-on power quality sensor(s) and/or central power quality unit sensor are battery powered. In an embodiment, all clamp-on power quality sensor(s) are battery powered.

In an embodiment, the power quality analysis system comprises one or more energy harvesting devices and at least some of the clamp-on power quality sensor(s) and/or the central power quality unit sensor are powered by at least one of the energy harvesting devices. Hereby, it is possible to provide a system that is partly or completely energy self-sufficient.

In an embodiment, all clamp-on power quality sensor(s) are powered by one or more energy harvesting devices.

In an embodiment, the at least one central power quality unit sensor is configured to pre-analyze the measured data to reduce the data load. Hereby, it is possible to reduce the data load and the required storage capacity.

The objects of the invention can be achieved by a method for carrying out a power quality analysis and detecting power quality distortions in an electrical environment that comprises:
  one or more power consuming units each being electrically connected to a main power supply by means of a multiconductor (multicore) cable; and
  a plurality of power quality sensors configured to provide one or more power quality analysis measurements,
wherein the method comprises the step of applying a plurality of power quality sensors being clamp-on power quality sensors to provide one or more power quality analysis measurements and to detect power quality distortions when the clamp-on power quality sensors are clamped onto the outside of or arranged in the proximity of the multiconductor cable, wherein the clamp-on power quality sensors are configured to provide the one or more power quality analysis measurements and to detect power quality distortions without being electrically connected to any of the single conductors of the multiconductor; i.e. by being clamped onto the outside of the multiconductor cable, wherein each of the clamp-on power quality sensors comprises a plurality of coils and/or Hall-effect sensors and/or capacitive probes, wherein the method comprises the step of applying at least one central power quality unit sensor arranged and configured to measure the over-all power quality, wherein the method comprises the step of applying a mathematical statistical model which combines measurements made by the clamp-on power quality sensors and measurements made by the central power quality unit sensor, wherein the multiconductor (multicore) cable comprises a plurality of distinct conductors that are insulated from each other, wherein the mathematical statistic model comprises:

- a mathematical function component modelling the latent mapping from the central power quality unit sensor measurements onto the clamp-on power quality sensors measurements; and
- a stochastic component modelling the measurement noise and the part of each central power quality unit sensor measurement associated with usage which are not measured by clamp-on power quality sensor(s).

Hereby, it is possible to provide a method that is easier to use and less expensive than the prior art methods.

The power consuming units may be any type of electrical device including, but not limited to, pumps, frequency converters, power supplies and domestic appliances configured to be electrically connected to a main power supply by means of a multiconductor cable.

In an embodiment, the main power supply is the mains.

The power quality sensors are configured to provide one or more power quality analysis measurements.

In an embodiment, the power quality sensors are configured to measure the frequency of a voltage signal (even if the frequency is varying).

In an embodiment, the power quality sensors are configured to measure the frequency of a current signal.

In an embodiment, the power quality sensors are configured to measure spikes having a larger amplitude than the maximum amplitude of the main sinus shape of a voltage current signal or a current signal.

In an embodiment, the power quality sensors are configured to measure harmonics currents/voltages overlying (superimposing) the main sinus shaped current/voltages. The one or more power quality sensors are clamp-on power quality sensors configured to provide one or more power quality analysis measurements when the clamp-on power quality sensors are clamped onto the outside of or arranged in the proximity of the multiconductor cable. Accordingly, no electrical contact to any of the conductors of the multiconductor cable is required. This is a major advantage compared with the prior art solutions.

The clamp-on power quality sensors are configured to provide the one or more power quality analysis measurements without being electrically connected to any of the conductors of the multiconductor.

In an embodiment, the method applies to at least one central power quality unit sensor arranged and configured to measure the over-all power quality.

By the term "central power quality unit sensor" is meant a unit configured to measure the overall power parameters (including voltage and/or current as a function of time) of at least a section of the power consuming units.

A "central power quality unit sensor" may be a "meter" configured to measure the overall flow or power including voltage and/or current versus time of at least a section of the power consuming units by a predefined accuracy, preferably a high accuracy. Such "central power quality unit sensor" or "meter" is typically used to perform precise measuring of electricity consumption.

When carrying out the method according to the invention it would be possible to apply clamp-on power quality sensors having significantly lower accuracy than the "central power quality unit sensors" or "meters". By using a mathematical statistic model, it is possible to "compensate" for the lower accuracy of the clamp-on power quality sensors. Hereby an overall measure of at least a section of the power consuming units can be provided.

It may be an advantage that the power quality analysis is carried out using a method comprising the step of applying a number of "central power quality unit sensors" or "meters" configured to measure power and/or voltage and/or current versus time of all the power consuming units and to send information to a receiving unit configured to process the data or forward the data.

It may be an advantage that the "central power quality unit sensors" or "meters" are capable of providing a very accurate measurement so that the detected data can be used to provide accurate estimates and/or predictions of parameters of the power consuming units.

It may be an advantage that the "central power quality unit sensors" or "meters" are capable of providing information of suspected power quality issues to the clamp-on power quality sensors, so they only need to send data from the suspected time interval. Significant usage of data bandwidth and sensor energy consumption can hereby be saved.

It may be an advantage that the method is carried out in such a manner that the "central power quality unit sensors" or "meters" pre-analyze the measurements to save data transfer bandwidth and sensor energy consumption.

It may be an advantage that the method is carried out in such a manner that the clamp-on power quality sensors pre-analyze the measurements to save data transfer bandwidth and sensor energy consumption.

It is possible to carry out the method in a manner, in which not all power consuming units are equipped with a clamp-on power quality sensor and where "central power quality unit sensors" or "meters" measure the power and/or current and/or voltage of more power consuming units than the power consuming units equipped with a clamp-on power quality sensor.

The mathematical statistic model is generally configured to estimate and/or predict one or more parameters (power and/or voltage and/or current and/or waveform and/or frequency) of the power consuming units on the basis of the information from the clamp-on power quality sensors and from the "central power quality unit sensors" or "meters" even if not all power consuming units are equipped with a clamp-on power quality sensor.

In an embodiment, a method comprises the step of applying at least one central power quality unit sensor arranged and configured to measure the over-all power quality.

In an embodiment, a method comprises the step of applying a mathematical statistical model which combines measurements made by the clamp-on power quality sensors and measurements made by the central power quality unit sensor. In an embodiment, the method comprises the step of synchronising the measurements from the clamp-on power quality sensor(s) and the central power quality unit sensor at a predefined frequency.

Hereby, it is possible to link corresponding measurements made by the clamp-on power quality sensor(s) and the central power quality unit sensor in order to compare the corresponding measurements.

In an embodiment, the predefined frequency is every 20 ms.

In an embodiment, the predefined frequency is every 10 ms.

In an embodiment, the predefined frequency is every 5 ms.

In an embodiment, the predefined frequency is every 2 ms.

In an embodiment, a method comprises the step of applying clamp-on power quality sensor(s) that are configured to measure both the magnetic field and the electric field of the multiconductor. Hereby, it is possible to measure both the currents and the voltages at the sensors and thereby achieve multiple power quality measurements directly from the single clamp-on power quality sensor.

In an embodiment, a method comprises the step of applying a central power quality unit sensor that is configured to measure both the magnetic field and the electric field of the multiconductor mains (cables). Hereby, it is possible to measure both the current and the voltage at the sensor and thereby achieve multiple power quality measurements directly from the single central power quality sensor/meter.

It may be an advantage that at least some of the clamp-on power quality sensor(s) and/or central power quality unit sensor are configured to communicate wirelessly with one or more external devices. Hereby, it is possible to provide a flexible and user-friendly method that is easy to use.

It may be an advantage that at least some of the clamp-on power quality sensor(s) and/or the central power quality unit sensor are battery powered.

In an embodiment, all clamp-on power quality sensor(s) are battery powered.

It may be advantageous that at least some of the clamp-on power quality sensor(s) and/or central power quality unit sensor are powered by at least one of the energy harvesting devices. Hereby, it is possible to provide a system that is partly or completely energy self-sufficient.

In an embodiment, all clamp-on power quality sensor(s) are powered by one or more energy harvesting devices.

In an embodiment, a method comprises the step of pre-analyzing the measured data made by the central power quality unit sensor to reduce the data load. Hereby, it is possible to reduce the data load and the required storage capacity.

The use of clamp-on power sensors to measure critical deviations in the power flow from the outside of existing multiconductor cables is advantageous.

In an embodiment, a system applies a mathematical model configured to map the "non-sense" data acquired by the clamp-on sensors into the needed analytics of the impact on the power quality, e.g., for all the machines in a production facility or consumers in a power grid.

This low-cost and easy to install solution can help leverage the entire production facility-management environment and is therefore a key-enabler technology.

The systems and methods disclosed herein provide several advantages including the ones listed below:

1. Avoid loss of production and the accompanying natural resources.
2. Higher production stability and thereby production efficiency.
3. Avoid loss of energy.
4. Increase competitiveness of European production lines.

The systems and methods apply clamp-on sensors, which are easy to click on existing cables without breaking into the installations.

It is beneficial that the mathematical statistic model comprises:
- a mathematical function component modelling the latent mapping from the central power quality unit sensor measurements onto the clamp-on power quality sensors' measurements; and
- a stochastic component modelling the measurement noise and the part of each central power quality unit sensor measurement associated with usage which are not measured by clamp-on power quality sensor(s), if any.

The mathematical statistic model may be of any suitable type capable of estimating the latent part of the current/voltage signal in the measurement that is associated with the sensors. As known from the field of statistical modelling, several approaches can be used to build a model of the specific class, e.g. time series analysis methods and/or multivariate data-analysis methods, such as Analysis of Variance (ANOVA), Markov models, Generalized Linear Models (GLM), and Multivariate Gaussian Models.

It may be an advantage that the calculation unit and the mathematical statistic model are integrated in an apparatus of the system. Hereby there is no need for a separate router and a very simple system can be provided.

It may be an advantage that the calculation unit and the mathematical model and the user interface are integrated in an apparatus of the system.

It may be an advantage that the calculation unit and the mathematical statistical model are integrated in a user interface. Such a system is simple and requires only few features.

In an embodiment, the calculation unit is a cloud service comprising a mathematical statistical model and data storage. The use of such cloud service makes it possible to connect other systems to the cloud service and hereby get additional data for the mathematical statistical model from other systems. Accordingly, a very complex and accurate mathematical statistical model can be developed. Moreover, trends may be detected faster when the cloud service gets additional data for the mathematical statistic model from other systems.

It may be an advantage that the data from the clamp-on power quality sensor(s) and/or central power quality unit sensor(s) are condensed throughout the data collection process, so only sufficient data to determine the latent process is transferred further on to the mathematical statistical model. Data may be condensed, e.g., by condensing a sequence of homologue status packages from a clamp-on power quality sensor to a single data package containing only the start and the end time of the actual status of the clamp-on power quality sensor(s). The data condensing may be performed, e.g., at one or more routers and/or clamp-on power quality sensor(s) and/or central power quality unit sensor(s).

The mathematical statistical model may be implemented in computer code, or directly in an integrated circuit.

It may be an advantage that a user interface has remote access to the system.

BRIEF DESCRIPTION OF THE DRAWINGS

The invention will become more fully understood from the detailed description given herein below. The accompanying drawings are given by way of illustration only, and thus, they are not limitative of the present invention. In the accompanying drawings:

FIG. 1A shows a graph depicting voltage as function of time, wherein the graph represents an example of poor power quality;

FIG. 1B shows a graph depicting voltage as function of time, wherein the graph represents an example of good power quality;

FIG. 6A shows a close-up view of a power quality sensor according to an embodiment of the invention;

FIG. 6B shows a power quality sensor clamped on a multiconductor cable of an electric device;

DETAILED DESCRIPTION

Referring now in detail to the drawings for the purpose of illustrating preferred embodiments of the present invention, a curve 50' showing voltage as a function of time is illustrated in FIG. 1A. It can be seen that the curve 50' comprises a plurality of spikes 52. Moreover, the curve 50' comprises harmonics that deviate from a sine waveform. Accordingly, the curve 50' represents an example of poor power quality.

FIG. 1B, on the other hand, illustrates a graph depicting voltage curve 50 as a function of time. The curve 50 represents an example of good power quality since the curve 50 fulfils the following criteria:
a) the supply voltage is steady and stays within the prescribed range,
b) the AC frequency is close to the rated value; and
c) the voltage curve is a smooth sine waveform.

As previously mentioned, in practice it is difficult and expensive to locate the source (electric device) causing a poor power quality (such as the one shown in FIG. 1A) because the prior art solutions must be electrically connected to the multiconductor electricity cables. Accordingly, the prior art solutions are difficult and costly to install.

Figure 2:
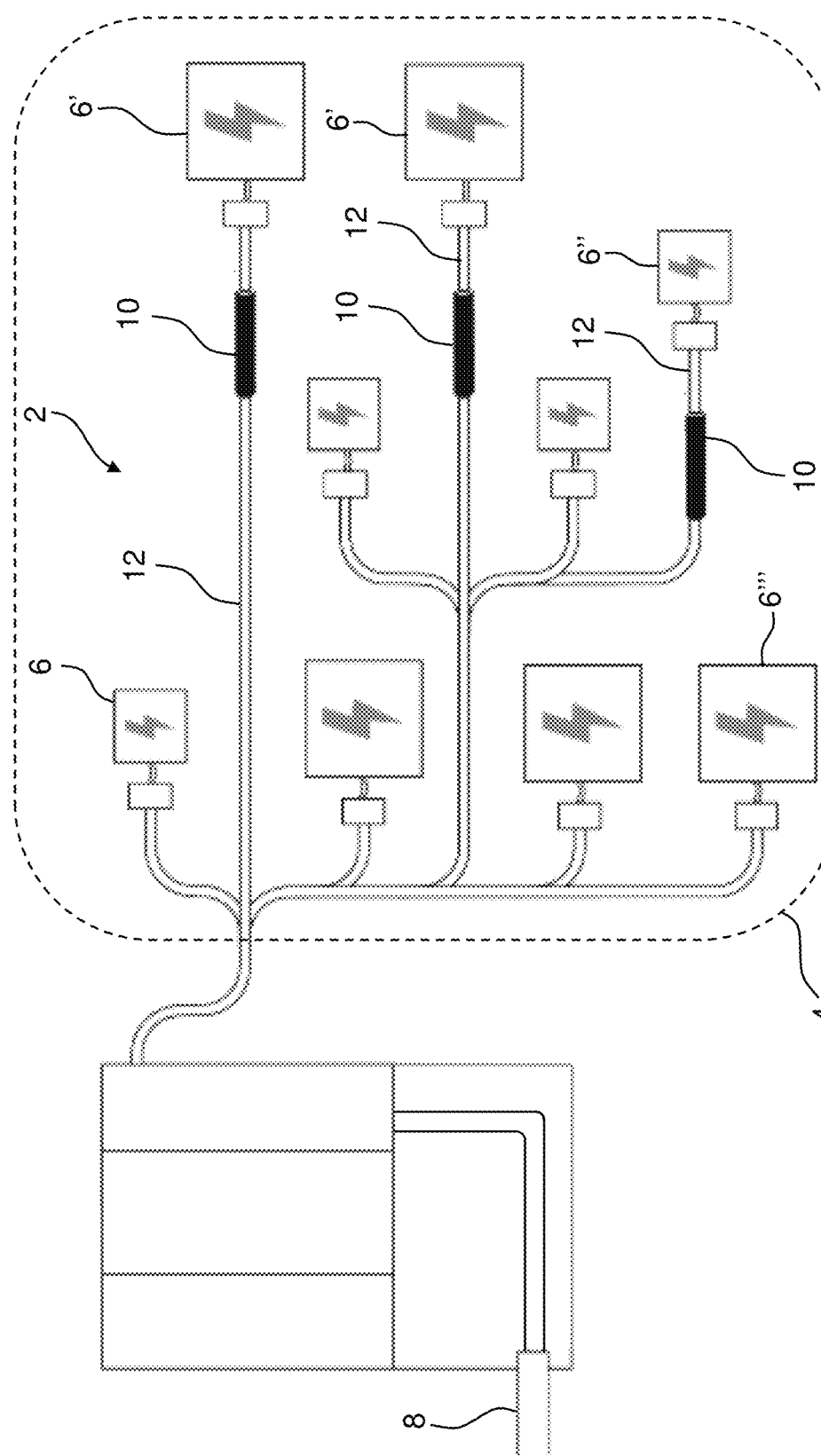
FIG. 2 shows a power quality analysis system according to an embodiment of the invention.

FIG. 2 illustrates a power quality analysis system 2 according to an embodiment of the invention. The power quality analysis system 2 is configured to carry out a power quality analysis in an electrical environment 4. The electrical environment 4 comprises a plurality of power consuming units 6, 6', 6'', 6''' each being electrically connected to a main power supply 8 by means of a multiconductor cable 12.

The electrical environment 4 comprises a plurality of clamp-on power quality sensors 10 arranged and configured to provide one or more power quality analysis measurements. The power quality sensors 10 are configured to provide one or more power quality analysis measurements when clamped onto the outside of or arranged in the proximity of one of the multiconductor cables 12. The clamp-on power quality sensors 10 are configured to provide the one or more power quality analysis measurement without being electrically connected to any of the conductors of the multiconductor 12. Accordingly, it is easier and less expensive to install these sensors 10 than the prior art sensors. Moreover, the sensors can easily be removed and arranged elsewhere in the electrical environment 4.

The multiconductor cables 12 are electrically connected to a main power supply 8. In an embodiment, the main power supply 8 is the mains.

By arranging the power quality sensors 10 in selected positions within the electrical environment 4, it is possible to locate devices that cause poor power quality. Accordingly, the power quality analysis system 2 makes it possible to locate the electric device(s) 6, 6', 6'', 6''' that cause the undesired power quality issues. Thus, by using the power quality analysis system 2 resources and money can be saved.

Figure 3:
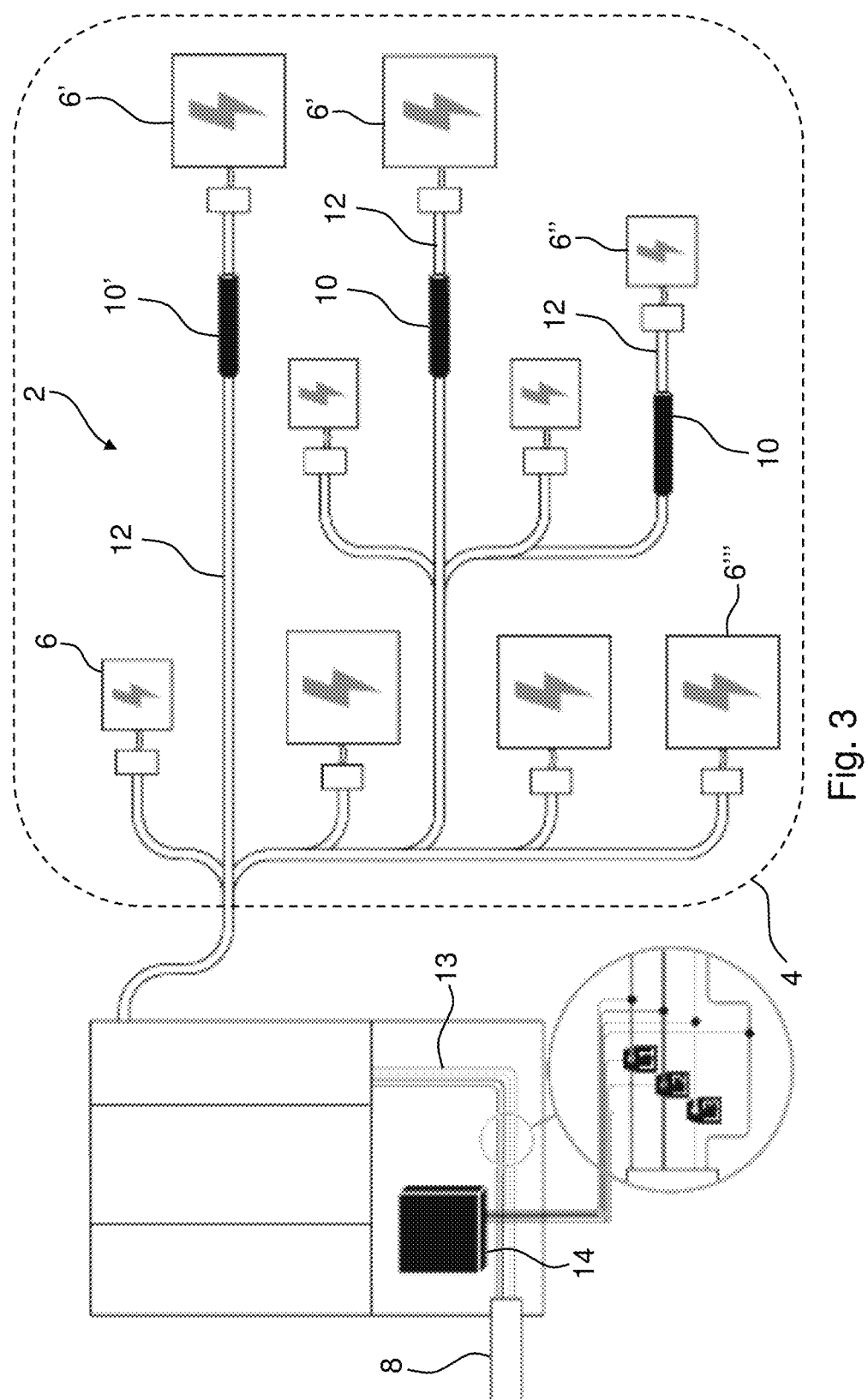
FIG. 3 shows another power quality analysis system according to an embodiment of the invention.

FIG. 3 illustrates another power quality analysis system 2 according to an embodiment of the invention. The power quality analysis system 2 basically corresponds to the one shown in FIG. 2. The power quality analysis system 2, however, comprises a central power quality unit sensor 14 arranged and configured to measure the over-all power quality of the electrical environment 4. Moreover, it can be seen that the main power supply 8 is electrically connected to the multiconductor cables 12 through a multiconductor cable 13 having a plurality of conductors. The central power quality unit sensor 14 is electrically connected to the connectors of the multiconductor cable 13.

FIG. 3 moreover illustrates how a system 2 according to an embodiment of the invention can be used to measure current flow in a main multiconductor cable 13 and in a number of smaller multiconductor cables 12.

The power supplied to the installation is metered by means of a single central power quality unit sensor (one main meter) 14 that provides measurements of high precision (e.g. approved by authorities or within standards for power measurements). The main multiconductor cable 13 is electrically connected to a plurality of smaller multiconductor cables 12, while a number of power quality sensors 10 are attached to the outside of some of these multiconductor cables 12.

In the following, we take a look at the metering at a single power quality sensor 10'. The power quality sensor 10' comprises one or more current sub-sensors and/or one or more voltage sub-sensors. Thus, the sensor signal changes with the current/voltage/power flow in the multiconductor cable 12.

In an embodiment, the clamp-on power quality sensors are configured to measure the currents flowing in the multiconductor cables by an array of one or more magnetic measurement sub-sensor(s), e.g., coils or Hall-effect sensors.

It may be an advantage to use multiple current sub-sensors in the power quality sensor to enable measurement of different superpositions of the magnetic fields generated by the currents flowing through the different conductors of the multiconductor cable, and thereby establish that the different currents are distinct from each other.

In an embodiment, the clamp-on power quality sensors are configured to measure the voltage in the multiconductor cable by an array of one or more electric field measurement sub-sensor(s), e.g. capacitive plates, capacitive probes or antennas.

It may be an advantage to use multiple voltage sub-sensors in the power quality sensor to enable measurement of different superpositions of the electric fields generated by the voltage in the different conductors of the multiconductor cable, and thereby establish that the different voltages are distinct from each other.

The signal from the power quality sensor 10' depends on the material and the dimension of the multiconductor cable 12, the sensor attachment and the electricity supply. Accordingly, and the sensor signal must be "transformed" or "adjusted/calibrated" to give the actual flow (the flow that would be achieved by using a high precision meter). In a prior art system, it would be necessary to apply "a high quality sensor" configured to measure flow in the specific environment (the dimensions of the multiconductor cable 12, the material of the multiconductor cable 12 and attachment type).

Since the present systems and methods apply a mathematical statistical model, it is possible to use a "simple" power quality sensor 10' to determine the current and/or voltage in each single conductor at the multiconductor cable 12. Accordingly, the use of a mathematical statistical model makes it possible to compensate for the mixed signals measured from the outside of multiconductor cables, and thereby allows for usage of the low precision and mixed signal measurements of the clamp-on power quality sensor 10'.

The power quality sensor 10' is attached to the outside of the multiconductor cable 12 and hereafter it is possible to sample a series of measurements from the power quality sensor 10' over a timespan.

In the same timespan, a series of measurements is sampled from the central power quality unit sensor (main meter) 14.

The mathematical statistical model is used to estimate the part of the central power quality unit sensor (main meter) 14 current that flows through the multiconductor cable 12 having the power quality sensor 10' attached to it. It is possible to carry out a time-dependent transformation of the measurements of power quality sensor 10' in order to correct for the actual environment of the power quality sensor 10'.

A less computer demanding approach can be obtained by using a mathematical statistical model to estimate if a time-independent transformation can be used. It may be an advantage to use the time-independent transformation, rather than the full mathematical statistical model, on the running measurements from the power quality sensor 10'.

It may be beneficial from time to time, to test if the precision of the transformation is acceptable, and update it if needed, using the mathematical statistical model.

The necessary number of samples needed can be obtained by estimating the measurement error of the transformation. In this manner, the results can be detained until the desired precision is obtained.

Figure 5:
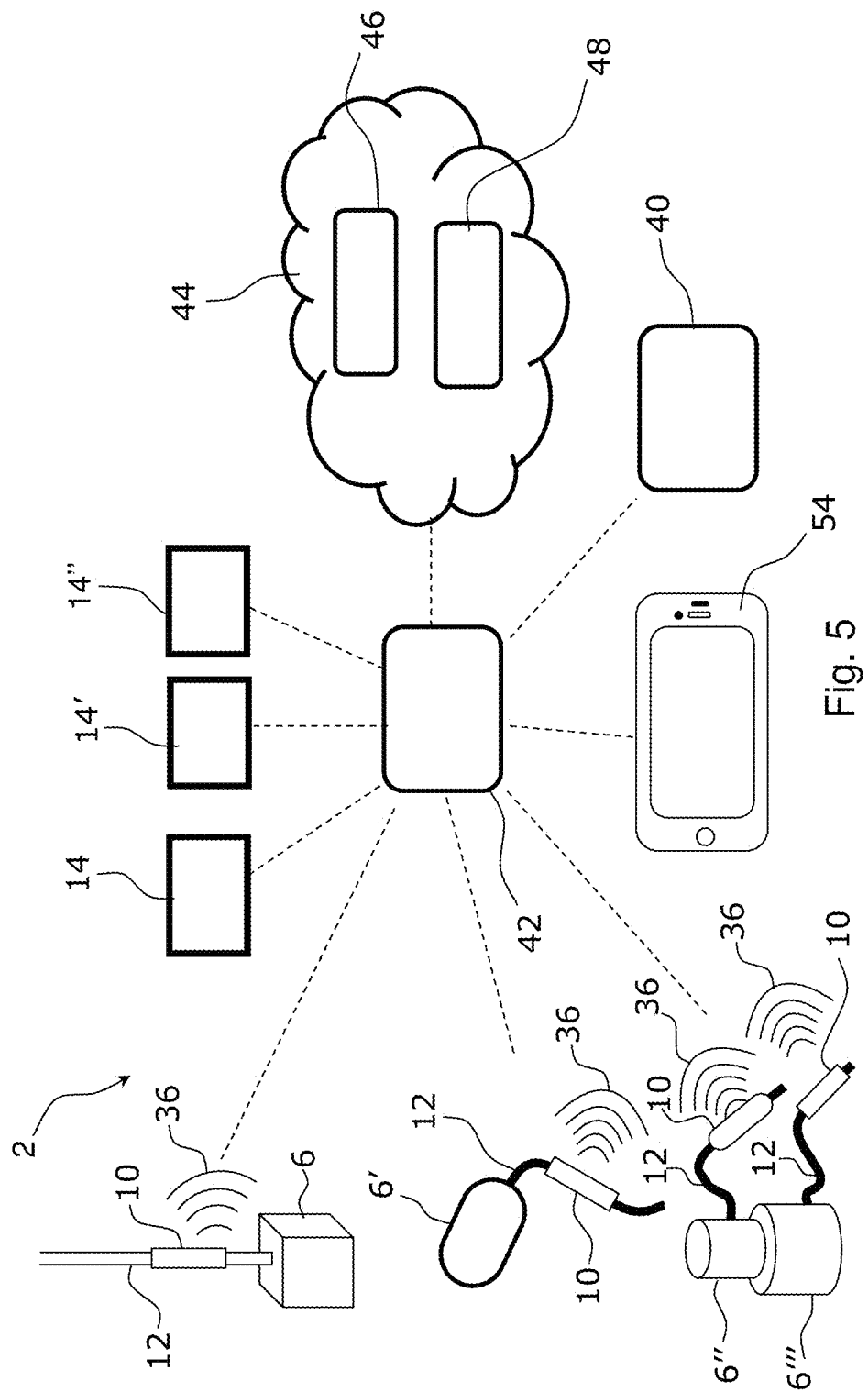
FIG. 5 shows a power quality analysis system according to an embodiment of the invention.

In the following, one method to estimate the latent stochastic process using a mathematical statistic model is described. The latent stochastic process can be modelled by e.g. a state space model defined by $$Y_t = F_t \theta_t + \varepsilon_t \; \varepsilon_t \sim N(0, V_t) \quad (1)$$

$$\theta_t = G_t \theta_{t-1} + \vartheta_t \; \vartheta_t \sim N(0, W_t) \quad (2)$$

where $Y_t$ is a vector determining (e.g. describing, or defining) the observed process at time t, comprising observed data from the sensor (10, 10') and/or the meters 14, 14', 14" (see FIG. 5); $\theta_t$ is a vector determining the latent stochastic process at time t, comprising latent process data, such as harmonics generated, device health status, current/voltage spikes, etc; $F_t$ is the regression matrix which determines the linear relation between the latent process and the observed process at time t; $G_t$ is the evolve matrix which determines the linear transition from time t−1 to time t in the latent process; $\varepsilon_t$ and $\vartheta_t$ are zero mean multivariate Gaussian distributed noise vectors of the observed process and the latent process respectively; $V_t$ is the observation variance-covariance matrix; and $W_t$ is the evolution variance-covariance matrix.

The model parameter matrices $F_t$ and $G_t$ may be estimated by e.g. the Kalman filter, using prior data from the modelled system and/or similar systems, hereunder the data provided by the user and/or experts in the field. Standard statistical methods can be used to conduct inference (e.g. estimate information) on the process. The information can be e.g. an estimated signal (e.g. trend) and/or forecasts (e.g. prognosis) of the process, and the related distributions of the estimates, variance and/or confidence intervals. Using these kinds of estimates, it is easy to e.g. raise warnings and/or alarms. For example, an alarm can be chosen to appear if the probability of an observed deviation in the process is less than 0.1% probable to occur by change.

The above model framework is a special case of the more general model framework $$Y_t = f_t(\theta_t) + \varepsilon_t \; \varepsilon_t \sim \delta_1(V_t) \quad (3)$$

$$\theta_t = g_t(\theta_{t-1}) + \vartheta_t \; \vartheta_t \sim \delta_2(W_t) \quad (4)$$

where $f_t$ and $g_t$ are general functions, $\delta_1$ and $\delta_2$ are general statistical distributions, and all other terms are as described above.

Inference on this more general model framework can be conducted by e.g. the extended Kalman filter in cases where the relation between the latent process and the observed process is non-linear, and the Kalman-Bucy filter in cases where the time is defined (e.g. described) on a continuous scale.

Other time series analysis method and/or multivariate data-analysis methods, such as Analysis of Variance (ANOVA), Markov models, Generalized Linear Models (GLM), and Multivariate Gaussian Models may as well be used to estimate the said latent stochastic process, and infer the said information.

Figures 4A, 4B, 4C:
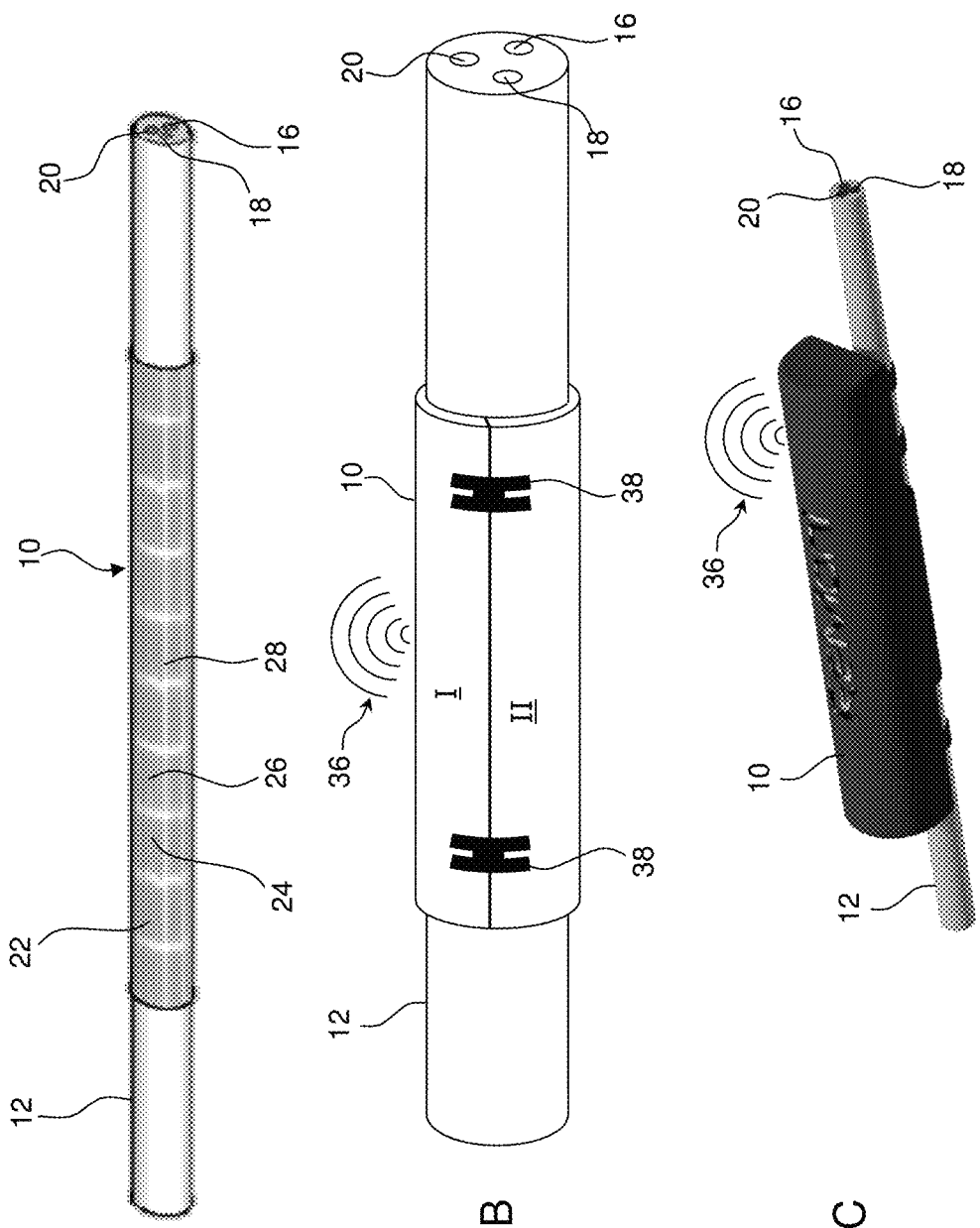
FIG. 4A shows a close-up view of a power quality sensor according to an embodiment of the invention.
FIG. 4B shows a close-up view of another power quality sensor according to an embodiment of the invention.
FIG. 4C shows a close-up view of another power quality sensor according to an embodiment of the invention.

FIG. 4A illustrates a close-up view of a power quality sensor 10 according to an embodiment of the invention. The power quality sensor 10 is attached to the outside of a multiconductor cable 12 having a circular cross-section and comprising three conductors 16, 18, 20 surrounded by an insulator.

The power quality sensor 10 comprises a built-in energy harvesting device comprising patch members 22, 24, 26 that are electrically separated by a separation member 28. The patch members 22, 24, 26 can also serve as voltage sub-sensors to measure the voltage in the multiconductor cable.

The power quality sensor comprising the energy harvesting device can be attached to the multiconductor cable 12 by any suitable means. In an embodiment, the power quality sensor is attached to the outside of the multiconductor cable 12 by means of glue. In another embodiment, the power quality sensor is attached to the outside of the multiconductor cable 12 by means of one or more mechanical structures.

The energy harvesting device is configured to harvest electrical energy from the cable 12 and supply the power consuming power quality sensor 10 with electrical power.

It is an advantage that the power quality sensor 10 is configured to be mounted on a cable 12 by means of glue or other mechanical attachment means allowing for a quick non-invasive attachment of the power quality sensor 10 to the cable 12.

FIG. 4B illustrates a close-up view of another power quality sensor 10 according to an embodiment of the invention. The power quality sensor 10 is attached to the outside of a multiconductor cable 12 comprising three conductors 16, 18, 20 surrounded by an insulator. The power quality sensor 10 comprises mechanical locking structures 38, 38' configured to maintain the power quality sensor 10 in a closed configuration. The power quality sensor 10 is cylindrical and comprises a first portion I and a second portion II rotatably or slidably attached to each other.

The power quality sensor 10 comprises a communication unit (not shown) configured to send wireless signals 36. Accordingly, the power quality sensor 10 can communicate with one or more external devices.

FIG. 4C illustrates a close-up view of another power quality sensor 10 according to an embodiment of the invention. The power quality sensor 10 is attached to the outside of a multiconductor cable 12 comprising three conductors 16, 18, 20 surrounded by an insulator. The power quality sensor 10 is attached to the multiconductor cable using cable ties.

The power quality sensor 10 comprises a communication unit (not shown) configured to send wireless signals 36. Accordingly, the power quality sensor 10 can communicate with one or more external devices.

FIG. 5 illustrates a power quality analysis system 2 according to an embodiment of the invention. The power quality analysis system 2 comprises a plurality of electrical devices 6, 6', 6", 6'" each being electrically connected to a main power supply (not shown) by means of a multiconductor cable 12. A power quality sensor 10 is clamped onto the outside of each of the multiconductor cables 12. In another embodiment, the power quality sensors 10 may be arranged in the proximity of the multiconductor cables 12.

Each power quality sensor 10 is configured to send a wireless signal 36 comprising information about the measurements made by the power quality sensor 10. The signals 36 are received by a router 42 that is configured to receive information from three power quality units 14, 14', 14". The power quality units (meters) 14, 14', 14" are arranged and configured to measure the over-all power quality of the electrical environment, in which the electrical devices 6, 6', 6", 6'" are installed.

The power quality analysis system 2 comprises a user interface 54. The user interface 54 is configured to provide access to generated information such as warnings, alarms and measurements of at least a selection of the electrical devices 6, 6', 6", 6'". The router 42 is communicating wirelessly with the user interface 54 that is represented by a smartphone.

The power quality analysis system 2 comprises a control unit 40. The router 4 is arranged and configured to communicate wirelessly with the control unit 40. The control unit 40 may be an actuator capable of regulating the activity of one or more of the electrical devices 6, 6', 6", 6'", or another device. Regulation of the activity of one or more of the electrical devices 6, 6', 6", 6'" may be carried out by changing the speed (of a pump or a motor) or by shutting down one or more of the electrical devices 6, 6', 6", 6'" by way of example.

The power quality analysis system 2 comprises a data storage unit 46 and a calculation unit configured to carry out calculations by using one or more predefined mathematical statistical models 48. In an embodiment, the power quality analysis system 2 comprises a cloud service 44 comprising the data storage 46 configured to store information received from the router 42 or data modified or calculated by the cloud service 44. In an embodiment, the cloud service 44 comprises the calculation unit configured to carry out calculations using the predefined mathematical statistical model 48. In an embodiment, the mathematical statistical model 48 is configured to estimate and/or forecast the impact of one or more of the devices 6, 6', 6", 6'" of the system 2.

Any suitable mathematical statistical model 48 may be applied and the mathematical statistical model 48 may conduct inference on combined data from one or more of the sensors 10 and from one or more of the power quality units 14, 14', 14" to estimate and/or forecast the activity of one or more of the devices 6, 6', 6", 6'".

FIG. 6B illustrates a power quality sensor 10 clamped on a multiconductor cable 12 of an electric device 6'. FIG. 6A illustrates a close-up view of the power quality sensor 10 shown in FIG. 6B.

It can be seen that the power quality sensor 10 transmits a wireless signal 36. This signal 36 generally includes information about the measurements made by the power quality sensor 10. The signal 36 is received by a calculation unit configured to carry out calculations using a predefined mathematical statistical model.

The power quality sensor 10 comprises a wireless transducer 32 configured to transmit wireless signals 36. The power quality sensor 10 comprises an energy harvester 34 configured to harvest energy (e.g. from the electric field of the cable 12). The power quality sensor 10 comprises a power manager 30 configured to manage the power harvested by the energy harvester 34.

Figures 7A, 7B, 7C:
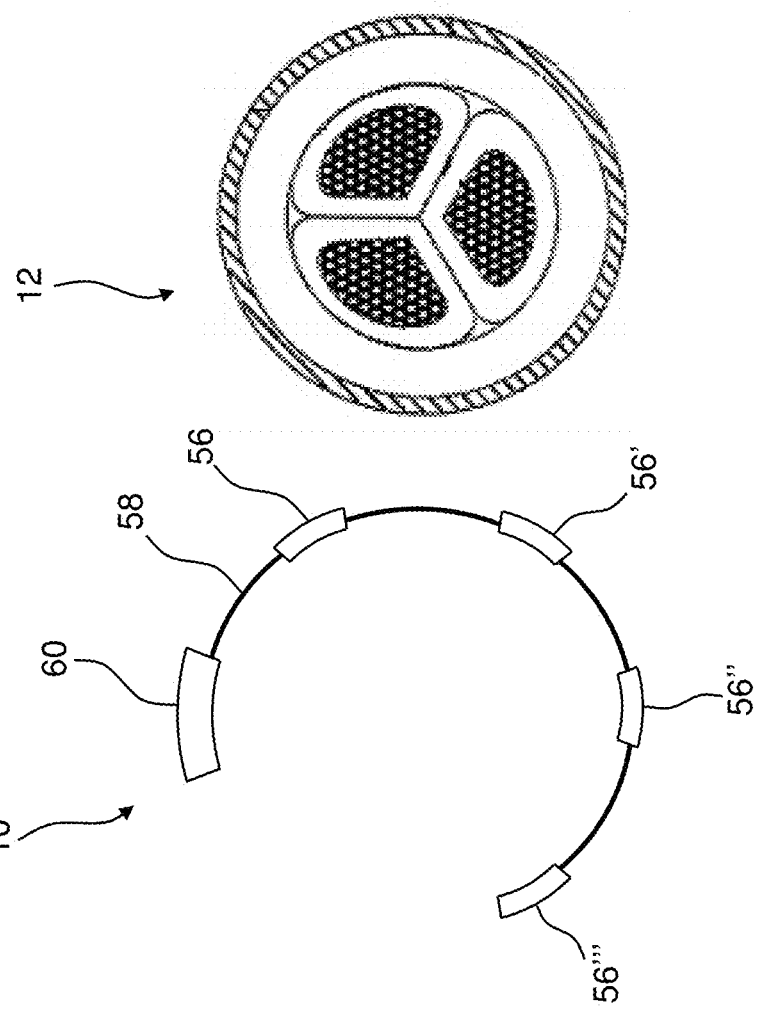
FIG. 7A shows a power quality sensor according to an embodiment of the invention.
FIG. 7B shows a multiconductor cable onto which a power quality sensor, such as the one shown in FIG. 7A, is configured to be clamped.
FIG. 7C shows the power quality sensor shown in FIG. 7A attached to (clamped onto) the multiconductor cable shown in FIG. 7B.

FIG. 7A illustrates a power quality sensor 10 according to an embodiment of the invention. The power quality sensor 10 comprises a plurality of sub-sensors 56, 56', 56", 56'", 60. In an embodiment, the sub-sensors 56, 56', 56", 56'", 60 comprise a main sensor member 60 and several additional sensor members 56, 56', 56", 56'". The main sensor member 60 is electrically connected to the additional sensor members 56, 56', 56", 56'" by means of an electrical connector 58.

The main sensor member 60 and each of the additional sensor members 56, 56', 56", 56'" are configured to detect an electromagnetic field caused by a current/voltage running in an underlying structure. By having several sensor members 60, 56, 56', 56", 56'", it is possible to arrange the sensor members 60, 56, 56', 56", 56'" in different tangential positions around a multiconductor cable 12 as shown in FIG. 7C. Hereby, it is possible to process data from the sensor members 60, 56, 56', 56", 56'" (e.g. by means of a signal processing unit (not shown) in order to separate the measured signals (the sum of magnetic fields created by current running through each of the conductors of the multiconductor cable 12, or voltage at the conductors) into contributions from each of the conductors of the multiconductor cable 12. In this way it is possible to, in case of a power quality distortion, detect which of the conductors of the multiconductor cable 12 causes the power quality distortion. This is a major advantage over the prior art because no electrical connection to the conductors of the multiconductor cable 12 is needed and because the power quality sensor 10 functions when clamped onto the outside of or arranged in the proximity of the multiconductor cable 12.

In an embodiment, the main sensor member 60 comprises an integrated communication unit (not shown). In an embodiment, the main sensor member 60 is configured to receive signals from the additional sensor members 56, 56', 56", 56''' and to transmit the signals measured by the main sensor member 60 as well as signals from the additional sensor members 56, 56', 56", 56''' to a receiving device either through a wired connection or through a wireless connection. FIG. 7B illustrates a multiconductor cable 12 onto which a power quality sensor 10, such as the one shown in FIG. 7A, is configured to be clamped.

FIG. 7C illustrates the power quality sensor 10 shown in FIG. 7A attached to (clamped onto) the multiconductor cable 12 shown in FIG. 7B. It is possible to use any suitable attachment structures to attach the power quality sensor 10 to the multiconductor cable 12. In an embodiment, the power quality sensor 10 is attached to the power cable 12 by means of one or more cable ties (not shown). A shield structure generally surrounds the power quality sensor 10 and the entire circumference of the part of the multiconductor cable 12 at which the power quality sensor 10 extends. In an embodiment, the power quality sensor 10 may be clamped onto the outside of or arranged in the proximity of a multiconductor cable 12 that does not comprise a shield structure.

The shield structure, however, may be used to isolate the power quality sensor 10 and the multiconductor cable 12 electrically from the environment through which the multiconductor cable 12 runs. In an embodiment, the shield structure is a conductive enclosure used to block electrostatic fields.

The main sensor member 60 and the additional sensor members (sub-sensors) 56, 56', 56", 56''' may be designed as coils and/or Hall-effect sensors and/or capacitive probes, which are placed in such a manner that the different sensor members (sub-sensors) 60, 56, 56', 56", 56''' measure different superpositions of the combined electromagnetic fields induced by the conductors inside the multiconductor cable 12.

LIST OF REFERENCE NUMERALS

2 Power quality analysis system
4 Electrical environment
6, 6', 6", 6''' Power consuming unit
8 Main power supply
10, 10' Power quality sensor
12, 13 Multiconductor (multicore) cable
14, 14', 14" Power quality unit
16, 18, 20 Conductor
22, 24, 26 Patch member
28 Separation member
30 Power manager
32 Wireless transducer
34 Energy harvester
36 Signal
38, 38' Mechanical locking structures
40 Control unit
42 Router
44 Cloud service
46 Data storage
48 Mathematical statistical model
50 Curve
52 Spike
54 User interface
56, 56', 56", 56''' Additional sensor member (sub-sensors)
58 Connector
60 Main sensor member (one of the sub-sensors)

What is claimed is:

1. A power quality analysis system for carrying out power quality analysis and detecting power quality distortions in an electrical environment, comprising:
   one or more power consuming units each electrically connected to a main power supply by a multiconductor cable that comprises a plurality of conductors insulated from each other;
   a plurality of clamp-on power quality sensors configured to provide one or more power quality analysis measurements and to detect power quality distortions when the clamp-on power quality sensors are clamped onto an outside of or arranged in proximity of the multiconductor cable, wherein the clamp-on power quality sensors are not electrically connected to any of the conductors of the multiconductor cable;
   wherein each of the clamp-on power quality sensors comprises a plurality of sub-sensors selected from coils, Hall-effect sensors, and/or capacitive probes positioned so that different sub-sensors measure different superpositions of combined electromagnetic fields induced by the conductors of the multiconductor cable;
   at least one central power quality unit sensor measuring overall power quality;
   a calculation unit adapted to use a mathematical statistical model which combines measurements made by the clamp-on power quality sensors and measurements made by the central power quality unit sensor, the mathematical statistical model comprising:
   1) a mathematical function component modelling latent mapping from the central power quality unit sensor measurements onto the clamp-on power quality sensor measurements; and
   2) a stochastic component modelling measurement noise and a part of each central power quality unit sensor measurement associated with usage not measured by the clamp-on power quality sensors.

2. The power quality analysis system according to claim 1, further comprising a time synchronization unit that synchronizes the measurements from the clamp-on power quality sensors and the central power quality unit sensor at a predefined frequency.

3. The power quality analysis system according to claim 1, wherein the clamp-on power quality sensors measure both the magnetic field and the electric field of the multiconductor cable.

4. The power quality analysis system according to claim 1, wherein the central power quality unit sensor measures both the magnetic field and the electric field of the multiconductor cable.

5. The power quality analysis system according to claim 1, wherein at least some of the clamp-on power quality sensors and/or the central power quality unit sensor communicate(s) wirelessly with one or more external devices.

6. The power quality analysis system according to one claim 1, further comprising one or more energy harvesting devices powering at least some of the clamp-on power quality sensors and/or the central power quality unit sensor.

7. The power quality analysis system according to claim 1, further comprising one or more energy harvesting devices harvesting energy, measuring voltage in the multiconductor cable, or both.

8. The power quality analysis system according to claim 1, wherein the central power quality unit sensor pre-analyzes the measured data to reduce data load.

9. A method for carrying out a power quality analysis and detecting power quality distortions in an electrical environment, comprising:
providing a power quality analysis system comprising:
one or more power consuming units each electrically connected to a main power supply by a multiconductor cable that comprises a plurality of conductors insulated from each other;
a plurality of clamp-on power quality sensors configured to provide one or more power quality analysis measurements and to detect power quality distortions when the clamp-on power quality sensors are clamped onto an outside of or arranged in proximity of the multiconductor cable, wherein the clamp-on power quality sensors are not electrically connected to any of the conductors of the multiconductor cable;
wherein each of the clamp-on power quality sensors comprises a plurality of sub-sensors selected from coils, Hall-effect sensors, and/or capacitive probes positioned so that different sub-sensors measure different superpositions of combined electromagnetic fields induced by the conductors of the multiconductor cable;
at least one central power quality unit sensor measuring overall power quality; and
applying a mathematical statistical model which combines measurements made by the clamp-on power quality sensors and measurements made by the central power quality unit sensor, the mathematical statistical model comprising:
1) a mathematical function component modelling latent mapping from the central power quality unit sensor measurements onto the clamp-on power quality sensor measurements; and
2) a stochastic component modelling measurement noise and a part of each central power quality unit sensor measurement associated with usage not measured by the clamp-on power quality sensors.

10. The method according to claim 9, further comprising synchronizing measurements from the clamp-on power quality sensors and the central power quality unit sensor at a predefined frequency.

11. The method according to claim 9, wherein the clamp-on power quality sensors measure both the magnetic field and the electric field of the multiconductor cable.

12. The method according to claim 9, wherein the central power quality unit sensor measure both the magnetic field and the electric field of the multiconductor cable.

13. The method according to claim 9, wherein at least some of the clamp-on power quality sensors and/or the central power quality unit sensor communicate(s) wirelessly with one or more external devices.

14. The method according to claim 9, wherein at least some of the clamp-on power quality sensors and/or the central power quality unit sensor is/are powered by at least one energy harvesting device.

15. The method according to claim 14, wherein the at least one energy harvesting device harvests energy, measures voltage in the multiconductor cable, or both.

16. The method according to claim 9, further comprising pre-analyzing the data measured by the central power quality unit sensor to reduce data load.

* * * * *